(12) United States Patent
Inoki et al.

(10) Patent No.: US 8,952,108 B2
(45) Date of Patent: Feb. 10, 2015

(54) ORGANIC SILICON COMPOUND, THERMOSETTING COMPOSITION CONTAINING SAID ORGANIC SILICON COMPOUND, AND SEALING MATERIAL FOR OPTICAL SEMICONDUCTOR

(75) Inventors: Daisuke Inoki, Kumamoto (JP); Kiichi Kawabata, Kumamoto (JP); Akio Tajima, Kumamoto (JP); Takashi Matsuo, Kumamoto (JP)

(73) Assignee: JNC Corporation, Tokyo (JP)

( * ) Notice: Subject to any disclaimer, the term of this patent is extended or adjusted under 35 U.S.C. 154(b) by 47 days.

(21) Appl. No.: 13/375,894

(22) PCT Filed: Jun. 2, 2010

(86) PCT No.: PCT/JP2010/059386
§ 371 (c)(1),
(2), (4) Date: Feb. 29, 2012

(87) PCT Pub. No.: WO2010/140635
PCT Pub. Date: Dec. 9, 2010

(65) Prior Publication Data
US 2012/0149819 A1 Jun. 14, 2012

(30) Foreign Application Priority Data
Jun. 2, 2009 (JP) .................................. 2009-133518

(51) Int. Cl.
G01N 1/28 (2006.01)
C08G 77/50 (2006.01)
C08G 77/04 (2006.01)
C09D 183/14 (2006.01)
C09K 3/10 (2006.01)
H01L 23/29 (2006.01)

(52) U.S. Cl.
CPC .............. *C08G 77/50* (2013.01); *C08G 77/045* (2013.01); *C09D 183/14* (2013.01); *C09K 3/1018* (2013.01); *H01L 23/296* (2013.01)
USPC ........................................................ 525/478

(58) Field of Classification Search
USPC ........................................................ 525/478
See application file for complete search history.

(56) References Cited

U.S. PATENT DOCUMENTS

| 6,509,423 | B1 * | 1/2003 | Zhu ............................. | 525/478 |
| 6,689,859 | B2 * | 2/2004 | Li et al. ........................ | 528/12 |
| 6,774,200 | B2 * | 8/2004 | Kobayashi et al. ............ | 528/31 |
| 7,198,645 | B2 * | 4/2007 | Lai et al. ....................... | 623/6.11 |
| 7,687,587 | B2 * | 3/2010 | Smith et al. ................... | 525/478 |
| 8,273,843 | B2 * | 9/2012 | Tajima et al. .................. | 528/31 |

(Continued)

FOREIGN PATENT DOCUMENTS

| JP | 61-112334 | 5/1986 |
| JP | 02-289611 | 11/1990 |

(Continued)

OTHER PUBLICATIONS

Machine Translation of JP 2007045971 A.*

(Continued)

*Primary Examiner* — Mike M Dollinger
(74) *Attorney, Agent, or Firm* — Wenderoth, Lind & Ponack, L.L.P.

(57) ABSTRACT

A liquid organosilicon compound comprising a structural unit represented by the following formula (1-a) and a structural unit represented by the following formula (1-b):

[Chem 1]

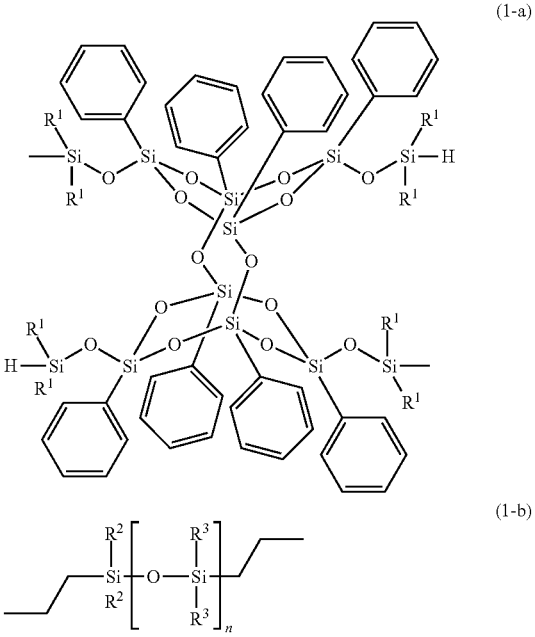

(1-a)

(1-b)

In the above formula (1-a), $R^1$ each independently is a group selected from an alkyl having 1 to 4 carbon atoms, cyclopentyl and cyclohexyl and in the above formula (1-b), $R^2$ and $R^3$ each independently are a group selected from an alkyl having 1 to 4 carbon atoms, cyclopentyl and cyclohexyl, and n is an integer of 2 to 50. When a mole fraction of the structural unit represented by the formula (1-a) in the liquid organosilicon compound is α and a mole fraction of the structural unit represented by the formula (1-b) in the liquid organosilicon compound is β, the ratio of α and n×β (α:n×β) meets 1:3 to 1:100.

14 Claims, No Drawings

(56) References Cited

U.S. PATENT DOCUMENTS

| | | | |
|---|---|---|---|
| 2004/0249103 A1 | 12/2004 | Morimoto et al. | |
| 2005/0009982 A1 | 1/2005 | Inagaki et al. | |
| 2005/0250925 A1 | 11/2005 | Oikawa et al. | |
| 2006/0052623 A1 | 3/2006 | Yoshida et al. | |
| 2006/0100410 A1 | 5/2006 | Ootake et al. | |
| 2006/0116499 A1 | 6/2006 | Ootake et al. | |
| 2007/0032454 A1 | 2/2007 | Morimoto et al. | |
| 2007/0190344 A1 | 8/2007 | Inagaki et al. | |
| 2009/0163652 A1* | 6/2009 | Tajima et al. | 524/612 |
| 2009/0225640 A1* | 9/2009 | Manabe et al. | 369/100 |
| 2010/0240855 A1 | 9/2010 | Inagaki et al. | |
| 2013/0096249 A1* | 4/2013 | Kawabata et al. | 524/547 |

FOREIGN PATENT DOCUMENTS

| | | |
|---|---|---|
| JP | 2003-277473 | 10/2003 |
| JP | 2004-331647 | 11/2004 |
| JP | 2006-070049 | 3/2006 |
| JP | 2007045971 A * | 2/2007 |
| JP | 2007-302635 | 11/2007 |
| WO | 03/024870 | 3/2003 |
| WO | 2004/024741 | 3/2004 |
| WO | 2004/081084 | 9/2004 |

OTHER PUBLICATIONS

Machine Translation of JP 2007-031619.*

International Preliminary Report on Patentability and Written Opinion issued Dec. 12, 2011 in International (PCT) Application No. PCT/JP2010/059386, of which the present application is the national stage.

International Search Report issued Sep. 21, 2010 in corresponding International Application No. PCT/JP2010/059386, of record.

Extended European Search Report issued Jan. 7, 2013 in corresponding European Application No. 10783417.8.

* cited by examiner

ORGANIC SILICON COMPOUND, THERMOSETTING COMPOSITION CONTAINING SAID ORGANIC SILICON COMPOUND, AND SEALING MATERIAL FOR OPTICAL SEMICONDUCTOR

TECHNICAL FIELD

The present invention relates to an organosilicon compound, a thermosetting composition comprising the compound which is useful for use of optical materials, electrically insulating materials and the like, a cured product obtainable by thermally curing the composition, and an encapsulation material for an optical semiconductor, using the composition.

BACKGROUND ART

In recent years, light emitting devices such as light emitting diode (LED) are put into practical use in various display boards, image reading light sources, traffic signals, large-sized display units, backlights of mobile phones, and the like. Those light emitting devices are generally encapsulated with a curable resin obtained by curing an aromatic epoxy resin and an alicyclic acid anhydride as a curing agent.

However, it is known that the aromatic epoxy resin system has the problems such that the alicyclic acid anhydride is easy to discolor with an acid, and it takes long time for the resin to be cured. Furthermore, the aromatic epoxy resin system has the problem such that a curable resin used for encapsulation turns yellow when a light emitting device is placed outdoor or is exposed to a light source generating ultraviolet rays.

To overcome those problems, a method for encapsulating LED and the like with a curable resin using an alicyclic epoxy resin or an acrylic resin, and a cationic polymerization initiator is attempted (see Patent Documents 1 and 2).

However, the cationically polymerized curable resin is very brittle and has the disadvantage that crack destruction occurs easily by a thermal cycle test (also called a heat cycle test). Furthermore, this curable resin has the disadvantage that coloration of the curable resin used for encapsulation after curing is remarkable as compared with the conventional curable resin using an aromatic epoxy resin and an acid anhydride. For this reason, the curable resin is not suitable for use which requires colorless transparency, especially use for LED encapsulation which requires heat resistance and transparency.

A resin composition for an encapsulation material of LED which is improved in occurrence of crack destruction by a thermal cycle test and which has excellent light resistance is investigated (see Patent Document 3). The resin composition disclosed in Patent Document 3 uses a hydrogenated epoxy resin and an alicyclic epoxy resin as matrix components, but since coloration after curing is considerable, the improvement in discoloration is still desired.

On the other hand, white LED is used for use such as illumination, and with increasing its output, generation of heat in a LED package cannot be disregarded. When an epoxy resin is used as an encapsulation material, yellowing due to its generation of heat cannot be prevented. For this reason, in place of an epoxy resin, a silicone resin has been used as an encapsulation material of white LED.

The silicone resin used in LED is roughly classified into two categories, namely, a phenyl silicone resin and a methyl silicone resin. The phenyl silicone resin which is generally used meets a refractive index. On the other hand, the phenyl silicone resin is excellent in heat resistance as compared with the epoxy resin, but is not yet sufficient to meet a high LED output.

Although the other resin, the methyl silicone resin, has very excellent heat resistance and weather resistance, the methyl silicone resin has the disadvantage that light extraction efficiency of LED is poor since it has low refractive index. Furthermore, the cured methyl silicone resin is very brittle, and has the disadvantage that crack destruction occurs easily by a thermal cycle test, and the disadvantage that adhesiveness to a polyamide resin used in an LED substrate is weak as compared with an epoxy resin and the like.

In view of the above, an encapsulation material that can meets large output of white LED and achieve a good balance of properties among high refractive index, heat resistance and the like, and a thermosetting composition used in the material are required.

On the other hand, Patent Documents 4 to 8 each disclose a cage-like silicon compound and its polymer. However, those are a solid or a crystal. Therefore, to apply to the uses of molding of LED and the like, a solvent for dissolving those is required.

CITATION LIST

Patent Document

Patent Document 1: JP-A-61-112334
Patent Document 2: JP-A-02-289611
Patent Document 3: JP-A-2003-277473
Patent Document 4: JP-A-2006-070049
Patent Document 5: WO2004/081084
Patent Document 6: JP-A-2004-331647
Patent Document 7: WO2003/24870
Patent Document 8: WO2004/24741

SUMMARY OF INVENTION

Technical Problem

One object of the present invention is to provide a thermosetting composition which can obtain a cured product having high refractive index, good transparency and good heat resistance. Other objects of the present invention are to provide a liquid organosilicon compound which is contained in the thermosetting composition, and a cured product, a molded body and an encapsulation material for light emitting diode, each comprising the thermosetting composition.

Solution To Problems

The present inventors have made investigations to solve the above problems. As a result, they have succeeded to synthesize a liquid organosilicon compound which contains a structure of a double decker silicon compound and does not require to use a solvent because the compound is not solid. They have further found that a cured product of a thermosetting composition comprising the above compound and a curing agent is excellent in transparency, heat resistance and the like, and have come to complete the present invention.

That is, the present invention has the following constitutions.

[1] A liquid organosilicon compound comprising a structural unit represented by the following formula (1-a) and a structural unit represented by the following formula (1-b):

[Chem 1]

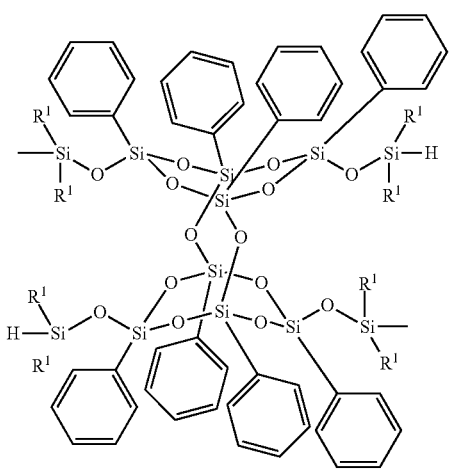

(1-a)

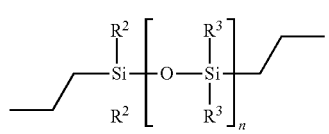

(1-b)

In the above formula (1-a), $R^1$ each independently represents a group selected from an alkyl having 1 to 4 carbon atoms, cyclopentyl and cyclohexyl and in the above formula (1-b), $R^2$ and $R^3$ each independently represent a group selected from an alkyl having 1 to 4 carbon atoms, cyclopentyl and cyclohexyl, and n is an integer of 2 to 50. When a mole fraction of the structural unit represented by the formula (1-a) in the liquid organosilicon compound is α and a mole fraction of the structural unit represented by the formula (1-b) in the liquid organosilicon compound is β, the ratio of α and n×β (α:n×β) meets 1:3 to 1:100.

[2] A method for producing a liquid organosilicon compound, which comprises subjecting a compound represented by the following formula (2-a) and a compound represented by the following formula (2-b) to a hydrosilylation reaction, wherein when a mole fraction of the structural unit represented by the formula (2-a) in the liquid organosilicon compound is α and a mole fraction of the structural unit represented by the formula (2-b) in the liquid organosilicon compound is β, those meet the following relation equation:

α:n×β=1:3 to 1:100

[Chem 2]

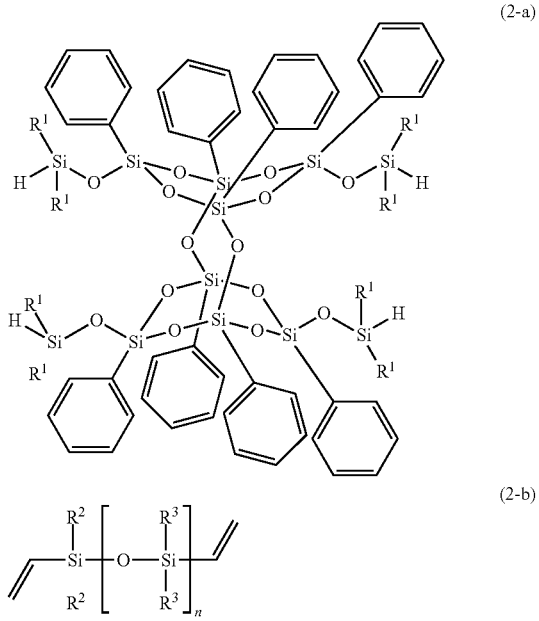

In the above formula (2-a), $R^1$ each independently represents a group selected from an alkyl having 1 to 4 carbon atoms, cyclopentyl and cyclohexyl and in the above formula (2-b), $R^2$ and $R^3$ each independently represent a group selected from an alkyl having 1 to 4 carbon atoms, cyclopentyl and cyclohexyl, and n represents an integer of 2 to 50.

[3] A thermosetting composition comprising (A) the liquid organosilicon compound described in [1] or the liquid organosilicon compound produced by the method described in [2], and (B) a silicon compound having at least two vinyl groups.

[4] The thermosetting composition described in [3], further comprising (C) a platinum catalyst.

[5] The thermosetting composition described in [3] or [4], further comprising (D) a silicon compound having at least two SiH groups at the terminals.

[6] The thermosetting composition described in any one of [3] to [5], further comprising at least one of silica and a fluorescent material dispersed therein.

[7] A cured product obtainable by thermally curing the thermosetting composition described in any one of [3] to [6].

[8] A molded body obtainable by molding the cured product described in [7].

[9] A coating film obtainable by applying the thermosetting composition described in any one of [3] to [6].

[10] An encapsulation material for an optical semiconductor, comprising the thermosetting composition described in any one of [3] to [6].

Advantageous Effects of the Invention

Since the organosilicon compound of the present invention is liquid, when it is used, it is not necessary to use a solvent. The cured product obtainable by using the thermosetting composition of the present invention has the properties of both high transparency and high refractive index; has excellent heat resistance as compared with the conventional phenyl silicone type encapsulation material; and further has excellent adhesive strength. Furthermore, the cured product has a double decker silsesquioxane skeleton, and therefore has excellent insulating property.

MODE FOR CARRYING OUT THE INVENTION

Organosilicon Compound of the Invention

The organosilicon compound of the present invention contains a structural unit represented by the following formula (1-a) and a structural unit represented by the following formula (1-b):

[Chem 3]

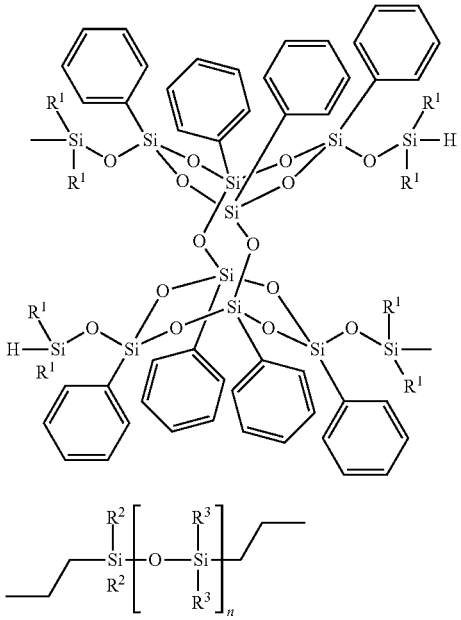

In the above formula (1-a), $R^1$ each independently is a group selected from an alkyl having 1 to 4 carbon atoms, cyclopentyl and cyclohexyl. In the above formula (1-b), $R^2$ and $R^3$ each independently are a group selected from an alkyl having 1 to 4 carbon atoms, cyclopentyl and cyclohexyl. $R^1$, $R^2$ and $R^3$ are preferably methyl, ethyl or propyl, and more preferably methyl. $R^1$, $R^2$ and $R^3$ may be substituted with phenyl in a range that the organosilicon compound obtained is liquid. n represents an integer of 2 to 50.

When a mole fraction of the structural unit represented by the formula (1-a) in the liquid organosilicon compound is α and a mole fraction of the structural unit represented by the formula (1-b) in the liquid organosilicon compound is β, the ratio of α and n×β (α:n×β) meets 1:3 to 1:100.

The organosilicon compound of the present invention is obtained by subjecting a compound represented by the following formula (2-a) (silsesquioxane derivative) and a compound represented by the following formula (2-b) (diorganopolysiloxane having vinyl groups at both terminals) to a hydrosilylation reaction.

[Chem 4]

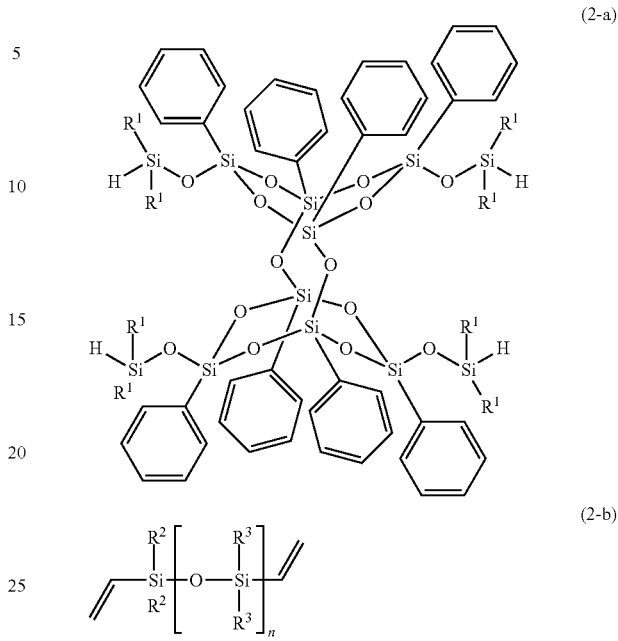

The hydrosilylation reaction between the compound represented by the above formula (2-a) and the compound represented by the above formula (2-b) can use the known methods, and the reaction is preferably carried out in a solvent.

The solvent used in the hydrosilylation reaction is not particularly limited so long as it does not impair the progress of the reaction. Examples of the preferred solvent include hydrocarbon solvents such as hexane and heptane; aromatic hydrocarbon solvents such as benzene, toluene and xylene; ether solvents such as diethyl ether, tetrahydrofuran (THF) and dioxane; halogenated hydrocarbon solvents such as methylene chloride and carbon tetrachloride; and ester solvents such as ethyl acetate. Those solvents may be used alone or as mixtures of two or more thereof. Among these solvents, aromatic hydrocarbon solvents are preferred, and among these, toluene is most preferred.

The hydrosilylation reaction can be carried out at room temperature under ordinary pressures. To promote the reaction, the reaction may be carried out under heating. The reaction may be carried out under cooling in order to control the generation of heat by the reaction, unfavorable reaction and the like.

In the hydrosilylation reaction a catalyst can be used, if necessary. Addition of the hydrosilylation reaction catalyst can facilitate progress of the reaction. Preferable examples of the hydrosilylation reaction catalyst include Karsted't catalyst, Spier catalyst and hexachloroplatinic acid; and these examples are generally well-known catalysts.

Since the above hydrosilylation reaction catalyst has high reactivity, the reaction can sufficiently be proceeded when a small amount of the catalyst is added. The amount of the catalyst to be used is $10^{-9}$ to 1 mol % in the proportion to a hydrosilyl group of a transition metal contained in the catalyst. The addition proportion is preferably $10^{-7}$ to $10^{-3}$ mol %.

The organosilicon compound of the present invention has the characteristic that the compound is liquid. The known organosilicon compound and its polymer have been a solid state or a crystalline state. Therefore, when a cured product was formed, the following steps were required: an organosilicon compound was dissolved in a solvent in order to enable the molding easily, the resulting solution is mixed with a silicon compound having at least two vinyl groups, a catalyst is further contained in the resulting mixture, and the mixture is applied to a substrate or the like, followed by thermally curing, thereby a coating film is formed into a molded body, or the mixture is poured in a casting mold, followed by thermally curing, thereby forming a molded body. Thus, since a solvent was necessarily contained in a molded body, such a molded body could not be used for use in which the presence of a solvent is disadvantageous.

The structure of the organosilicon compound of the present invention is controlled by inhibiting crosslinking so as to be in the form of liquid. Specifically, α and β in the above formulae (1-a) and (1-b) or the above formulae (2-a) and (2-b) represent mole fractions of the respective structural units in the liquid organosilicon compound. By setting the ratio of α and n×β (α:n×β) at 1:3 to 1:100, the organosilicon compound can be made in the form of liquid. Furthermore, when a thermosetting composition was prepared, its cured product has high refractive index and excellent transparency and heat resistance (resistance to thermal yellowing and heat-resistant transparency).

In addition, the above α is preferably 2 to 20, and when the α is 1, the β is preferably 1 to 2. In the above ratio, in the case where n×β is smaller than 3, an organosilicon compound is not obtained in the form of liquid. In the case where n×β exceeds 100, the desired effect is not exhibited when a thermosetting composition is prepared.

In view of controlling the structure and in view of making excellent characteristics remarkably when formed into a cured product, the (α:n×β) is preferably 1:3 to 1:75, more preferably 1:3 to 1:50, and further preferably 1:3 to 1:25.

The term "liquid" in the present invention means to have a fluidity at 25° C., and specific examples includes viscous liquid and starch syrup-like substance. In the case of starch syrup-like substance, the substance may be warmed to about 60° C. in order to increase fluidity, and be used for the preparation of a curable composition.

The viscosity at 25° C. of the organosilicon compound of the present invention is preferably 100 to 1,000,000 Pa·s, and more preferably 500 to 100,000 Pa·s. The viscosity can be measured with an E-type viscometer.

Furthermore, the molecular weight of the liquid organosilicon compound of the present invention is preferably 3,000 to 100,000 in terms of a weight average molecular weight (Mw).

In addition, a cured product obtainable by preparing and curing a thermosetting composition comprising the organosilicon compound of the present invention has excellent refractive index, transparency and heat resistance (resistance to thermal yellowing and resistance to transparency), and the organosilicon compound of the present invention is therefore an excellent raw material for a cured product in which defects of a cured product comprising a phenyl silicone resin and a methyl silicone resin generally used are improved.

In the case of using in LED and the like, when a cured product has a refractive index of 1.4 or more, it can be used without problem. The refractive index is preferably 1.49 or more, and the upper limit thereof is not particularly limited.

The silsesquioxane derivative which is the compound represented by the above formula (2-a) can be synthesized by, such as, the method disclosed in WO2004/024741.

Examples of the compound represented by the formula (2-a) (hereinafter referred to as "DD-4H") are shown below.

[Chem 5]

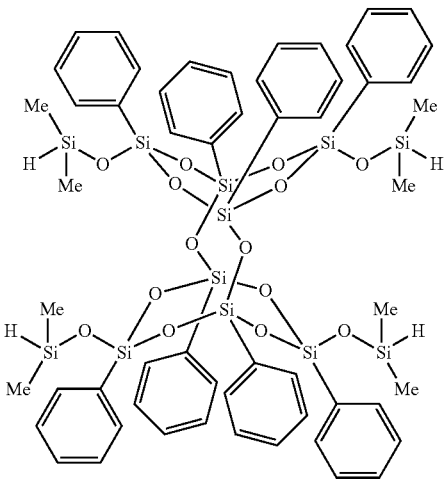

Diorganopolysiloxane having vinyl groups at both terminals, which is the compound represented by the above formula (2-b) can be synthesized by the known methods, and may be a commercially available compounds.

The compound represented by the formula (2-b) can be produced by, such as, using 1,3-divinyl-1,1,3,3-tetramethyldisiloxane (DVDS) represented by the following structure. Other examples of the compound includes 1,3-divinyl-1,3-dimethyl-1,3-diphenyldisiloxane and the like.

[Chem 6]

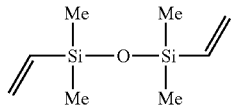

The value of n in the formula (2-b) represents an integer of 2 to 50, and preferably 2 to 30. The value of n in the formula (2-b) can be adjusted by appropriately adjusting molar ratios of raw materials (such as, DVDS and octamethylcyclotetrasiloxane) to be used in synthesis.

The thermosetting composition of the present invention contains (A) a liquid organosilicon compound comprising the structural unit represented by the formula (1-a) and the structural unit represented by the formula (1-b) or a liquid organosilicon compound obtainable by hydrosilylation reaction of the compound represented by the above formula (2-a) and the compound represented by the above formula (2-b), and (B) a silicon compound having at least two vinyl groups. A cured product can be obtainable by further adding (C) a curing catalyst to the thermosetting composition and then heating. In addition, a preferred embodiment also includes a thermosetting composition which further comprises (D) a silicon compound having at least two SiH groups at the terminals to the above thermo setting composition.

The above (B) silicon compound having at least two vinyl groups is not particularly limited so long as it is a silicon compound having at least two vinyl groups for crosslinking, and for example, a straight-chain polysiloxane having vinyl groups at both terminals and a branched polysiloxane having at least two vinyl groups at the terminals can be used.

Specific examples of (B) the silicon compound include 1,1,3,3-divinyltetramethyldisiloxane, 1,1,5,5-divinylhexamethyltrisiloxane, a straight-chain polysiloxane having vinyl groups at both terminals, and a branched polysiloxane having a T-structure and having terminal vinyl groups.

The molecular weight of (B) the silicon compound having at least two vinyl groups is preferably 150 to 10,000 and more preferably 200 to 5,000.

The above (B) silicon compound having at least two vinyl groups may be used alone or as mixtures of two or more of different kinds of compounds.

In addition, (D) the silicon compound having at least two SiH groups at the terminals is not particularly limited so long as it is a silicon compound having at least two SiH groups for crosslinking, and for example, a straight-chain polysiloxane having SiH groups at both terminals, a straight-chain polysiloxane having SiH groups in side chains, and a branched polysiloxane having at least two SiH groups at the terminals can be used.

Specific examples include 1,3,5,7-tetramethylcyclotetrasiloxane, 1,1,3,3,5,5-hexa-methyltrisiloxane, a straight-chain polysiloxane having SiH groups at both terminals, and a branched polysiloxane having a T-structure and having terminal SiH groups.

The molecular weight of (D) the silicon compound having at least two SiH groups at the terminals is preferably 150 to 10,000, and more preferably 200 to 5,000.

The above (D) silicon compound having at least two SiH groups at the terminals may be used alone or as mixtures of two or more of different kinds of compounds.

The molecular weight of these compounds is a weight average molecular weight when the molecular weight range falls within the range which is measurable by using GPC, and is a molecular weight calculated from the structure of a compound when the molecular weight is too low to be measured using GPC.

In the thermosetting composition of the present invention, the content of the above compound (A) is preferably 30% by mass or more, more preferably 40% by mass or more, and further preferably 50% by mass or more, based on the total amount of (A), (B) and (D), from the standpoint of heat resistance.

Furthermore, the content of the above (B) is preferably 1 to 70% by mass, more preferably 3 to 60% by mass, and further preferably 5 to 50% by mass, based on the total amount of (A), (B) and (D).

In the thermosetting composition of the present invention, the content ratio between the total SiH groups and the total vinyl groups is preferably 1:2 to 2:1 in terms of functional group molar ratio between SiH group and vinyl group.

The above (C) curing catalyst is not particularly limited so long as it is a transition metal catalyst generally used as a reaction catalyst. A platinum catalyst is preferably used. General hydrosilylation catalyst can be selected as an example of the platinum catalyst. Examples of the preferred hydrosilylation catalyst include Karsted't catalyst, Spier catalyst and hexachloroplatinic acid.

The amount of the above (C) curing catalyst to be used is preferably 0.1 ppm to 10 ppm, and more preferably 0.5 ppm to 4 ppm, in terms of mass ratio of a transition metal contained in the catalyst to the thermosetting composition. When the amount of (C) the curing catalyst added is 0.1 ppm or more, curing is good. Furthermore, when the addition amount is 10 ppm or less, the thermosetting composition can preferably be used since pot life after the preparation of the thermosetting composition is not too short, and the curing product obtained is difficult to be colored.

The thermosetting composition of the present invention does not require a solvent. As described before, polysilsesquioxane is a solid state, but the organosilicon compound of the present invention is a liquid state. That is, even though a silicon compound having at least two vinyl groups is solid, the composition of the present invention is liquid. Since the thermosetting composition of the present invention can be used in the case where incorporation of a solvent is not preferred, uses of the thermosetting composition greatly is expanded.

The thermosetting composition of the present invention may further comprises at least one component selected from the following (i) to (viii).

(i) Powdery reinforcing materials and fillers. For example, metal oxides such as aluminum oxide and magnesium oxide; silicon compounds such as silica fine powder, fused silica and crystalline silica; transparent fillers such as glass beads; metal hydroxides such as aluminum hydroxide; others such as kaolin, mica, quartz powder, graphite, and molybdenum disulfide. These are preferably added in a range that transparency of the thermosetting composition of the present invention is not impaired. When these are added, the mass ratio of these to the total amount of the thermosetting composition of the present invention is preferably a range of 0.1 to 0.6.

(ii) Colorants or pigments. For example, titanium dioxide, molybdenum red, iron blue, ultramarine, cadmium yellow, cadmium red and organic dyes can be listed.

(iii) Flame retardants. For example, antimony trioxide, bromine compound and phosphorus compound can be listed.

(iv) Ion adsorbent.

The proportion when the above components (ii) to (iv) are added is 0.0001 to 0.30 in mass ratio to the total amount of the thermosetting composition, (v) Silane coupling agents.

(vi) Nanoparticle dispersions of metal oxides such as zirconia, titania, alumina and silica.

(vii) Phenol type, sulfur type and phosphorus type antioxidants. The preferred proportion when an antioxidant is used is a range of 0.0001 to 0.1 in terms of mass ratio to the total amount of the thermosetting composition.

(viii) Ultraviolet absorbers for improving light resistance. The preferred proportion when using an ultraviolet absorber is a range of 0.0001 to 0.1 in mass ratio to the total amount of the thermosetting composition.

(viii) Ultraviolet absorbers for improving light resistance. The preferred proportion when using a curing accelerator is a range of 0.0001 to 0.1 in mass ratio to the total amount of the thermosetting composition.

The thermosetting composition of the present invention can be prepared by, such as, the following method. (A) The silicon compound of the present invention, (B) the silicon compound having vinyl groups at at least both terminals, (C) the curing catalyst, and, if necessary, the above optional components are mixed by stirring, and the pressure is reduced to carry out defoaming. The resulting mixture is poured in a mold, heated at 100° C. for 1 hour, and finally heated at 150° C. for 1 to 2 hours to cure the mixture.

Heat resistance of the cured product obtained by thermally curing the thermosetting composition of the present invention is evaluated by heat-resistant transparency and resistance to thermal yellowing. The heat-resistant transparency can be evaluated by measuring transmittance of a cured product before and after a heat resistance test using a UV visible spectrophotometer and evaluating retention rate of its light transmittance. In addition, the resistance to thermal yellowing can be evaluated by retention rate of yellowness (YI value) of a cured product before and after a heat resistance test.

The yellowness (YI value) at 180° C. and the retention rate of light transmittance of the cured product obtained by thermally curing the thermosetting composition of the present invention are preferably 5 or less and 90% or more, respectively. When the respective values are fallen with those ranges, the cured product is colorless and has high transparency, and therefore can particularly preferably used in fields of optical semiconductor encapsulation materials and the like which requires transparency.

The fact that the heat-resistant transparency of the cured product obtained by thermally curing the thermosetting composition of the present invention is very good is due to the structure of a silsesquioxane derivative which is the compound represented by the above formula (2-a).

Namely, a double decker silsesquioxane skeleton gives, due to its steric structure, excellent property in heat-resistant transparency as compared with silsesquioxane having a general random structure, and furthermore, gives the effect of suppressing coloration of a cured product during heating.

By molding the cured product obtained by thermally curing the thermosetting composition of the present invention, such a molded body can be used in various uses. In addition, by dispersing at least one of silica and a fluorescent body in the thermosetting composition of the present invention, the thermosetting composition has light-emitting function and therefore can be used as an LED composition. Furthermore, examples of the uses of the thermosetting composition include optical semiconductor encapsulation materials, semiconductor encapsulation materials, insulating films, sealing materials, adhesives and optical lenses.

Examples of the silica include fumed silica and colloidal silica. The content of the silica in the thermosetting composition of the present invention is preferably 1 to 50% by mass, and more preferably 1 to 20% by mass.

Example 1

The present invention is described in further detail below by reference to Examples. However, it should be noted that the invention is not construed as being limited to the following Examples.

The number average molecular weight and the weight average molecular weight of the compound synthesized in the present invention were measured as follows.

Those molecular weights were obtained by using a high-speed chromatograph system CO-2065 plus manufactured by JASCO Corporation, using 20 μg of a THF solution having a sample concentration of 1% by mass as an analytical sample, measuring the sample with a GPC method using Column: Shodex KF804L (manufactured by Showa Denko K.K.) (connecting two columns in series) under the conditions of column temperature: 40° C., detector: RI, eluent: THF, and flow rate of eluent: 1.0 mL/min, and converting the values obtained into polystyrene.

Synthesis Example 1

Synthesis of Silsesquioxane Derivative (DD-4H)

Phenyl trimethoxysilane (6,540 g), sodium hydroxide (880 g), ion-exchanged water (660 g) and 2-propanol (26.3 liters) were charged in a reaction vessel equipped with a reflux condenser, a thermometer and a dropping funnel. While stirring the resulting mixture under nitrogen stream, heating (80° C.) was initiated. The mixture was stirred for 6 hours from the initiation of stirring, and was allowed to stand at room temperature (25° C.) overnight. Then, the reaction mixture was transferred to a filter, and filtered by pressuring with nitrogen gas. The obtained solid was washed with 2-propyl alcohol once, filtered, and then dried at 80° C. under reduced pressure to obtain a colorless solid (DD-ONa) (3,300 g) represented by the following formula.

[Chem 7]

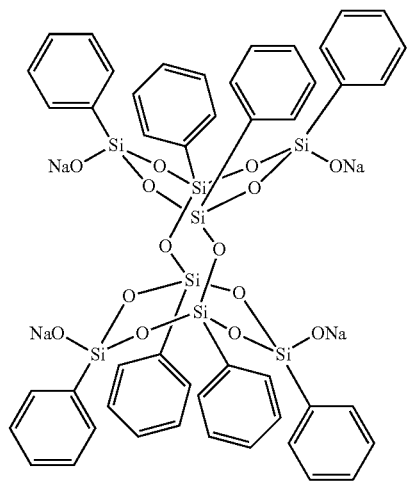

Next, cyclopentyl methyl ether (2,005 g), 2-propanol (243 g), ion-exchanged water (1,400 g) and hydrochloric acid (461 g) were charged in a reaction vessel equipped with a reflux condenser, a thermometer and a dropping funnel, and were stirred at room temperature (25° C.) in nitrogen atmosphere. The compound (DD-ONa) obtained above (800 g) and cyclopentyl methyl ether (2,003 g) were charged in the dropping funnel to form a slurry. The slurry was added dropwise to the reaction vessel over 30 minutes. After completion of the dropwise addition, the resulting mixture was stirred for 30 minutes.

Thereafter, the resulting mixture was allowed to stand to separate into an organic layer and an aqueous layer. The obtained organic layer was neutralized by washing with water, dusts were removed by a membrane filter, and the organic layer was concentrated with a rotary evaporator at 60° C. under reduced pressure to obtain 678 g of a colorless solid. The colorless solid was washed with methyl acetate (980 g), and dried under reduced pressure to obtain a colorless powdery solid (DD-40H) (496 g) represented by the following formula.

[Chem 8]

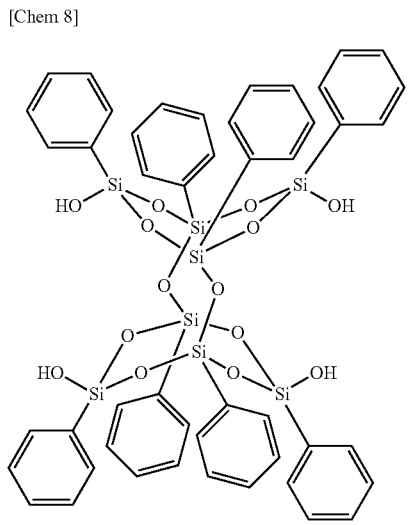

Next, the compound (DD-40H) obtained above (7,160 g), toluene (72,600 g) and dimethylchlorosilane (2,850 g) were charged in a reaction vessel equipped with a dropping funnel, a thermometer and a reflux condenser, and sealed with dry nitrogen. Triethylamine (3,230 g) was added dropwise to the reaction vessel from the dropping funnel over about 20 minutes. In this case, a solution temperature was 35 to 40° C. After completion of adding dropwise, the resulting mixture was stirred for 1 hour. Then, ion-exchanged water (16,700 g) was added, an excess amount of dimethylchlorosilane was hydrolyzed, and the resulting mixture was separated into an organic layer and an aqueous layer. The organic layer was neutralized by washing with water, and then concentrated at 85° C. under reduced pressure using a rotary evaporator. The residue obtained was washed with methanol (19,950 g) to obtain 8,587.6 g of a colorless solid. The colorless solid was washed with methyl acetate (9,310 g) and dried under reduced pressure to obtain a colorless powdery solid (7,339 g).

From the following analytical result, it was confirmed that the colorless powdery solid had the following structure (DD-4H). $^1$H-NMR (solvent: CDCl$_3$), δ (ppm): 0.16 (d, 24H), 4.84-4.89 (m, 4H), 7.05-7.50 (m, 40H). $^{29}$Si-NMR (solvent: CDCl$_3$): δ (ppm): 3.85 (s, 4Si), −71.90 (s, 4Si), −75.05 (s, 4Si).

[Chem 9]

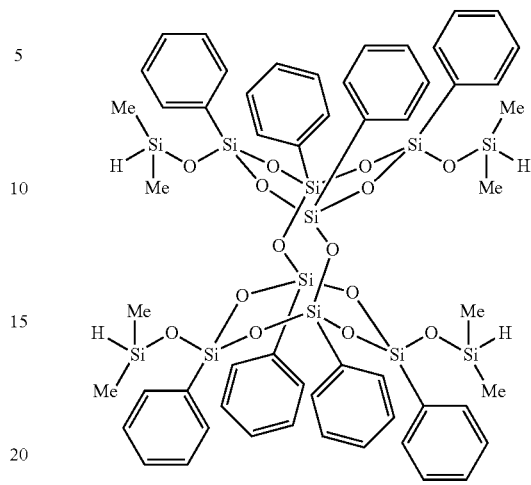

Synthesis Example 2

Synthesis of Diorganopolysiloxane 1

A porcelain stir bar, a cooling pipe and a thermometer were attached to a 500 ml four-necked flask, and 1,1,3,3-divinyltetramethyldisiloxane (100 g) (0.538 mol), octamethylcyclotetrasiloxane (400 g) (1.35 mol) and activated earth (5.0 g) as an acid catalyst were charged. The temperature was increased to 80° C. to carry out the reaction for 22 hours, and then cooled to room temperature (25° C.). The activated earth was removed by filtration with a 5C filter paper. The filtrate was transferred to an eggplant flask, and low boiling components were distilled away at 120° C. under reduced pressure of 5 mmHg with an evaporator. Thus, a colorless transparent liquid (diorganopolysiloxane 1) (460 g) was obtained. $^{29}$Si-NMR was measured, and n and vinyl group equivalent were obtained from a ratio in integral intensity between the peak of a molecular chain terminal Si and the peak of a molecular chain inner Si. The average of n in the following formula was 11, and the vinyl group equivalent was calculated as 450 g/mol.

[Chem 10]

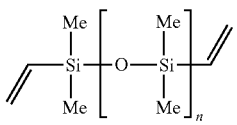

Example 1

The silsesquioxane derivative (DD-4H) which was produced in Synthesis Example 1 and the compound represented by the formula (2-a) and the diorganopolysiloxane 1 having vinyl groups at both terminals which was produced in Synthesis Example 2, which is the compound represented by the formula (2-b) were mixed so as to be α=0.5 and β=0.5, and the compound (1-1) was produced by the following hydrosilylation reaction.

The silsesquioxane derivative (DD-4H) produced in Synthesis Example 1 (100 g), the diorganopolysiloxane 1 having vinyl groups at both terminals produced in Synthesis Example 2 (70.8 g) (equimolar amount to DD-4H), and toluene (750 g) as a solvent were placed in a 1 liter reaction vessel equipped with a thermometer, a reflux condenser and a stirrer.

Stirring was initiated while heating under the nitrogen atmosphere. After the components reached 70° C., 2 µl of Karsted't catalyst (3 wt % xylene solution) was added, and the stirring was carried out at 70° C. under heating for 5 hours. Thereafter, disappearance of vinyl group peak (5.9-6.3 ppm) was confirmed by H-NMR, and then the reaction was completed. Toluene was distilled away with an evaporator at 100° C. under conditions of reduced pressure of 5 mmHg.

The obtained viscous liquid was dissolved in acetone (222 g), activated carbon (1.4 g) was added, and stirring was carried out overnight. The activated carbon was removed by filtration using 0.2 µl filter under reduced pressure, and the filtrate was distilled again under conditions of reduced pressure of 5 mmHg at 70° C. to distill away acetone using an evaporator to obtain a compound (160 g) which was a colorless starch syrup-like substance.

As a result of analyzing the molecular weight of the obtained compound, the number average molecular weight: Mn was 5,400 and the weight average molecular weight: Mw was 64,600. Furthermore, the SiH equivalent was 1,100 g/mol.

Synthesis Example 3

Synthesis of Diorganopolysiloxane 2

A porcelain stir bar, a cooling pipe and a thermometer were equipped to a 500 ml four-necked flask, and 1,1,3,3-divinyltetramethyldisiloxane (100 g) (0.538 mol), octamethylcyclotetrasiloxane (350 g) (1.18 mol) and activated earth (4.5 g) as an acid catalyst were charged. After the temperature was increased to 80° C., the reaction was carried out for 22 hours, and then the reaction mixture was cooled to room temperature. The activated earth was removed by filtration using a 5C filter paper. The filtrate was transferred to an eggplant flask, and low boiling components were distilled away under conditions of reduced pressure of 5 mmHg at 120° C. using an evaporator to obtain a colorless transparent liquid (diorganopolysiloxane 2) (410 g) was obtained. Si-NMR was measured, and n and vinyl group equivalent were obtained from a ratio in integral intensity between the peak of Si at the terminal of the molecular chain terminal and the peak of Si inside of the molecular chain. The average of n in the following formula was calculated as 9.5, and the vinyl group equivalent was calculated as 400 g/mol.

[Chem 11]

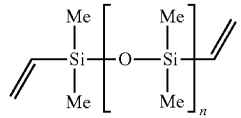

Example 2

The silsesquioxane derivative (DD-4H) produced in Synthesis Example 1 which was the compound represented by the formula (2-a) and the diorganopolysiloxane 2 having vinyl groups at both terminals produced in Synthesis Example 3 which was the compound represented by the formula (2-b) were mixed so as to be α=0.57 and β=0.43, and the compound (1-2) was produced by the following hydrosilylation reaction.

A porcelain stir bar, a cooling pipe and a thermometer were equipped to a 2,000 ml four-necked flask, and the silsesquioxane derivative (DD-4H) produced in Synthesis Example 1 (100 g), the diorganopolysiloxane 2 having vinyl groups at both terminals produced in Synthesis Example 3 (57.8 g) (0.75 times mol of DD-4H), and toluene (890 g) as a solvent were charged.

Stirring was initiated while heating under the nitrogen atmosphere. After the components reached 70° C., 2 µl of Karsted't catalyst (3 wt % xylene solution) was added, and the reaction was carried out at 70° C. for 3 hours. Thereafter, the reaction was carried out at 100° C. for 3 hours. After, disappearance of vinyl group peak (5.9-6.3 ppm) was confirmed by H-NMR, the reaction was accomplished. The obtained reaction mixture was transferred to an eggplant flask, and toluene was distilled away with an evaporator under conditions of reduced pressure of 5 mmHg at 100° C.

The obtained viscous liquid was dissolved in acetone (350 g), activated carbon (1.7 g) was added, and stirring was conducted for 5 hours. The activated carbon was filtered using 0.2 µl filter under reduced pressure. The filtrate was distilled again under conditions of reduced pressure of 5 mmHg at 70° C. using an evaporator to distill away acetone. Thus, a compound (170 g) which was a colorless viscous liquid was obtained.

As a result of analyzing the molecular weight of the obtained compound using GPC, the number average molecular weight: Mn was 2,200 and the weight average molecular weight: Mw was 6,800. Furthermore, the SiH equivalent was 850 g/mol.

Synthesis Examples 4 to 7

Synthesis of Diorganopolysiloxanes 3 to 6

Diorganopolysiloxanes 3 to 6 were synthesized in the same manner as in Synthesis Example 2, except that the amounts of 1,3-divinyl-1,1,3,3-tetramethyldisiloxane (DVDS) and octamethylcyclotetrasiloxane (D4) charged were changed. The average of n and the vinyl equivalent of the diorganopolysiloxanes 3 to 6 were shown in Table 1. In addition, in Synthesis Example 6, hexamethylcyclotrisiloxane (D3) was used in place of octamethylcyclotetrasiloxane (D4).

TABLE 1

| | | DVDS (g) | D4 (g) | Yield (g) | Vinyl group equivalent (g/mol) | Average of n |
|---|---|---|---|---|---|---|
| Synthesis Example 2 | Polysiloxane 1 | 100 | 400 | 460 | 450 | 11 |
| Synthesis Example 3 | Polysiloxane 2 | 100 | 350 | 410 | 400 | 9.5 |
| Synthesis Example 4 | Polysiloxane 3 | 100 | 239 | 280 | 350 | 8 |
| Synthesis Example 5 | Polysiloxane 4 | 150 | 239 | 350 | 250 | 5 |
| Synthesis Example 6 | Polysiloxane 5 | 150 | 195 (D3) | 305 | 200 | 3 |
| Synthesis Example 7 | Polysiloxane 6 | 50 | 404 | 430 | 850 | 21.5 |

Examples 3 to 9 and Comparative Examples 1 and 2

Compounds (1-3) to (1-9) were prepared in the same manner as in Example 1 in the proportions of the silsesquioxane derivative (DD-4H) produced in Synthesis Example 1 and the diorganopolysiloxanes 3 to 6 produced in Synthesis Examples 4 to 7 as shown in Table 2.

In addition, Compounds (1-10) and (1-11) were prepared in the same manner as in Example 1, except for using the commercially available DVDS and DVTS in place of the diorganopolysiloxane 1 produced in Synthesis Example 2.

Reaction conditions of Examples 1 to 9 and Comparative Examples 1 and 2, and SiH equivalent, appearance and viscosity of the obtained Compounds (1-1) to (1-11) were shown in Table 2. The relationship ($\alpha$:n×$\beta$) in molar ratio between (a) silsesquioxane derivative (DD-4H) and (b) diorganopolysiloxane was shown in Table 3.

Vinyl silicone A: Organopolysiloxane represented by the average compositional formula $(Me_3SiO_{1/2})_{1.5}(ViMe_2SiO_{1/2})_{1.5}(PhSiO_{3/2})_6$ Vinyl silicone B: Organopolysiloxane represented by the average compositional formula $(Me_3SiO_{1/2})_2(ViMe_2SiO_{1/2})_2(PhSiO_{3/2})_4$ Vinyl silicone C: Organopolysiloxane represented by the average compositional formula $(Me_3SiO_{1/2})_3(ViMe_2SiO_{1/2})_3(PhSiO_{3/2})_3$ Vinyl silicone D: Organopolysiloxane represented by the average compositional formula $(Me_3SiO_{1/2})_{2.5}(ViMe_2SiO_{1/2})_{1.25}(PhSiO_{3/2})_5$ SiH silicone A: Organopolysiloxane represented by the average compositional formula $(Me_3SiO_{1/2})_2(HMe_2SiO_{1/2})_2(PhSiO_{3/2})_4$ The above five silicones can be synthesized using the conventional methods.

TABLE 2

| | | Polysiloxane containing vinyl groups at both terminals | | | | | Viscosity (mPa · s) | | |
|---|---|---|---|---|---|---|---|---|---|
| | | Vinyl equivalent g/mol | Average of n | Molar ratio/ DD-4H | SiH equivalent (g/mol) | Property | 25° C. | 40° C. | 60° C. |
| Example 1 (1-1) | Polysiloxane 1 | 450 | 11 | 1 | 1,100 | Starch syrup | >100,000 | >100,000 | 97,500 |
| Example 2 (1-2) | Polysiloxane 2 | 400 | 9.5 | 0.75 | 850 | Liquid | >100,000 | 89,000 | 25,000 |
| Example 3 (1-3) | Polysiloxane 3 | 350 | 8 | 0.75 | 820 | Liquid | >100,000 | >100,000 | 35,000 |
| Example 4 (1-4) | Polysiloxane 4 | 250 | 5 | 0.75 | 760 | Starch syrup | >100,000 | >100,000 | >100,000 |
| Example 5 (1-5) | Polysiloxane 4 | 250 | 5 | 1 | 910 | Starch syrup | >100,000 | >100,000 | >100,000 |
| Example 6 (1-6) | Polysiloxane 5 | 200 | 3 | 1 | 850 | Starch syrup | >100,000 | >100,000 | >100,000 |
| Example 7 (1-7) | Polysiloxane 6 | 850 | 21.5 | 1 | 1,400 | Liquid | 25,000 | 8,400 | 2,800 |
| Example 8 (1-8) | Polysiloxane 2 | 400 | 9.5 | 0.87 | 930 | Liquid | >100,000 | 46,100 | 15,400 |
| Example 9 (1-9) | Polysiloxane 3 | 350 | 8 | 0.87 | 900 | Liquid | >100,000 | >100,000 | 58,400 |
| Comparative Example 1 (1-10) | DVDS | 93.2 | 1 | 1 | — | Solid | No fluidity | No fluidity | No fluidity |
| Comparative Example 2 (1-11) | DVTS | 130.2 | 2 | 1 | — | Solid | No fluidity | No fluidity | No fluidity |

TABLE 3

| Compound | (1-1) | (1-2) | (1-3) | (1-4) | (1-5) | (1-6) | (1-7) | (1-8) | (1-9) | (1-10) | (1-11) |
|---|---|---|---|---|---|---|---|---|---|---|---|
| ($\alpha$:n × $\beta$) | 1:11 | 1:7.125 | 1:6 | 1.3.75 | 1:5 | 1:3 | 1:21.5 | 1:8.265 | 1:6.96 | 1:1 | 1:2 |

Preparation of a thermosetting composition, a cured product obtained from the composition, and property evaluation test method were described below.

Major materials used are as follows.

Liquid organosilicon compounds: Compounds (1-1) to (1-9) synthesized in the Examples DVDS: 1,3-Divinyl-1,1,3,3-tetramethyldisiloxane DVTS: 1,5-Divinyl-1,1,3,3,5,5-hexamethyltrisiloxane DV4S: 1,7-Divinyl-1,1,3,3,5,5,7,7-octamethyltetrasiloxane $D^V_4$: 1,3,5,7-Tetravinyl-1,3,5,7-tetramethylcyclotetrasiloxane The above four compounds can use the commercially available products, and can be available from, such as, Gelest, Inc. In the following description, Ph indicates phenyl, Vi indicates vinyl and Me indicates methyl.

Preparation of Thermosetting Composition

A mixture of each compound synthesized in the Examples and polyorganosiloxane was placed in a screw pipe. The screw pipe was set to a planetary centrifugal mixer (manufactured by Thinky Corporation, AWATORI Rentaro ARE-250), and mixing and defoaming were performed to obtain a varnish. A platinum catalyst was added in an amount of 1 ppm in terms of platinum, and mixing and defoaming were again performed using the planetary centrifugal mixer. Thus, thermosetting compositions 1 to 18 and comparative composition 1 were obtained.

The mixing ratio of each composition was shown in Tables 4 and 5.

Preparation of Cured Product

The above thermosetting composition was poured in Teflon (registered mark) PFA Petri dish manufactured by Flon Industry. The varnish poured in the Petri dish was placed in an oven, and heated in the order of 80° C. for 1 hour, 120° C. for 1 hour and 150° C. for 2 hours sequentially to cure the varnish. Thus, the cured product was obtained. NAFLON SP packing (diameter: 4 mm) manufactured by Nichias Corporation was sandwiched as a spacer between two glasses, and a varnish was poured therein. After defoaming under reduced pressure, the varnish was cured by heating in the same manner as above. Glasses were peeled, and a cured product having a thickness of 4 mm and having smooth surface was obtained.

Measurement of Light Transmittance

The transmittance was measured with UV visible spectrophotometer UV-1650 manufactured by Shimadzu Corporation. Furthermore, total light transmittance was calculated from the transmittance of 400 nm to 800 nm.

The transparency of a cured product was visually judged by the presence or absence of coloration. In the case of no coloration, the case was judged that transparency was good. In the case of evaluating transparency in more detail, total light transmittance was calculated and the transparency was judged.

Refractive Index

A test piece was prepared according to JIS K7142 by cutting a cured product using a band saw machine. Refractive index of this test piece was measured using D ray (586 nm) of a sodium lamp with an Abbe refractometer (NAR-2T, manufactured by Atago Co., Ltd.). Methylene iodide was used as an intermediate liquid.

Hardness

According to JIS K6253, hardness was measured by Durometer WR-105D manufactured by Nishi-Tokyo Seimitsu.

Heat Resistance Test

Heat resistance test was carried out and evaluated by the following method.

Two cured products having a thickness of 4 mm were prepared, and the respective light transmittances were measured with UV visible spectrophotometer, and the value measured was used as initial transmittance. The cured products were placed in an oven heated at 180° C. (constant temperature drying oven: DX302, manufactured by Yamato Scientific Co., Ltd.), and heat-treated for a certain period of time (160 hours in Table 6, and 260 hours in Table 8).

Heat-Resistant Transparency

Light transmittance of a cured product after the test was measured using UV visible spectrophotometer. From the transmittances at wavelengths of 400 nm, 370 nm and 350 nm, retention rate at each of these wavelengths (transmittance after heat treatment for a certain period of time/initial transmittance at each wavelength×100) was calculated, and heat-resistant transparency was evaluated. The retention rate of light transmittance at 180° C. is preferably 90% or more.

Resistance To Thermal Yellowing

Yellowness of (YI value) of a cured product was measured using a color meter manufactured by Suga Test Instruments Co., Ltd. and evaluated according to JIS K7105. The retention rate of yellowness (YI value) at 180° C. is preferably 5 or less.

Curing Shrinkage

In the above preparation of a cured product, after completion of the curing by heating, the cured product was cooled. When the cured product was easily removed from PFA Petri dish, it was judged that curing shrinkage was occurred. This was caused because that a gap is generated between the cured product and the PFA Petri dish by curing shrinkage.

Adhesive Strength Test

A test piece was prepared by molding a polyphthalamide resin (Model A (trade name) A-4122NLWH905, manufactured by Solvey Advanced Polymers K.K.) as a substrate into a plate having a thickness of 2 mm, and adjusting the size according to JIS K6850. Adhesive test was conducted using 1 kN road cell by a tensile and compression testing machine (Autograph AGS-500B manufactured by Shimadzu Corporation) according to JIS K6850.

Heat Cycling Test

Heat cycling test was carried out by placing the cured product prepared by the above method in a test area of a hot-cold shock testing equipment TSA-101S-W manufactured by Espec Corp., and repeating 100 cycles, each cycle consisting of exposure of the cured product at −40° C. for 30 minutes and exposure of the cured product at 105° C. for 30 minutes. Traveling time between two exposure temperatures was 5 minutes.

Refractive indexes and results of durometer hardness test of the cured products 1 to 18 and the comparative cured product 1 which were obtained by curing the compositions 1 to 18 and the comparative composition 1 shown in Tables 4 and 5, respectively, were shown in Tables 6 and 7, respectively.

When observing as to whether or not yellowing occurred at a heat resistance test (180° C., 160 hours), yellowing was observed in the comparative cured product 1 which did not contain a silsesquioxane structure. Regarding the transmittance at 400 nm, all of the cured products 1 to 18 held the transmittance of 95% or more of the initial transmittance, whereas the transmittance of the comparative cured product 1 was decreased to 70% of the initial transmittance.

TABLE 4

| | | | Composition of thermosetting composition | | | |
|---|---|---|---|---|---|---|
| | Functional group | Functional group equivalent (g/mol) | Composition 1 | Composition 2 | Composition 3 | Composition 4 |
| Compound (1-1) | SiH | 1100 | 10 | 8.8 | | |
| Compound (1-2) | H | 850 | | | 10 | 10 |
| Compound (1-9) | SiH | 900 | | | | |
| SiH silicone A | H | 700 | | | | |
| DVDS | Vi | 93 | 0.87 | | 1.12 | |
| DVTS | Vi | 130 | | | | |
| DV4S | Vi | 167 | | | | |
| $D^V_4$ | Vi | 86 | | 0.69 | | |
| Vinyl silicone A | Vi | 730 | | | | 8.26 |

| | Composition 5 | Composition 6 | Composition 7 | Composition 8 | Composition 9 |
|---|---|---|---|---|---|
| Compound (1-1) | | | | | |
| Compound (1-2) | 10 | 10 | 10 | | |
| Compound (1-9) | | | | 10 | 10 |
| SiH silicone A | 1 | 2 | 3 | | |
| DVDS | | | | | |
| DVTS | | | | 1.54 | |
| DV4S | | | | | 1.97 |
| $D^V_4$ | | | | | |
| Vinyl silicone A | 9.2 | 10.2 | 11.2 | | |

TABLE 5

| | | | Composition of thermosetting composition | | | | |
|---|---|---|---|---|---|---|---|
| | Functional group | Functional group equivalent (g/mol) | Composition 10 | Composition 11 | Composition 12 | Composition 13 | Composition 14 |
| Compound (1-9) | SiH | 900 | 10 | 10 | 10 | 10 | 10 |
| SiH silicone A | H | 700 | | | | | |
| Vinyl silicone A | Vi | 730 | 8.23 | 5 | 3.57 | 2.25 | |
| Vinyl silicone B | Vi | 520 | | 2.5 | 3.75 | 4.5 | 5.1 |
| Vinyl silicone C | Vi | 304 | | | | | |
| Vinyl silicone D | Vi | 392 | | | | | |

| | Composition 15 | Composition 16 | Composition 17 | Composition 18 | Comparative Composition 1 |
|---|---|---|---|---|---|
| Compound (1-9) | 10 | 10 | 10 | 10 | |
| SiH silicone A | | | | | 10 |
| Vinyl silicone A | | | | | 10 |
| Vinyl silicone B | 6.1 | | | | |
| Vinyl silicone C | | 3.6 | | | |
| Vinyl silicone D | | | 4.6 | 7.6 | |

TABLE 6

Refractive index, hardness and presence or absence of yellowing of cured products obtained by curing compositions of Table 4

| | Cured product 1 | Cured product 2 | Cured product 3 | Cured product 4 | Cured product 5 | Cured product 6 | Cured product 7 | Cured product 8 | Cured product 9 |
|---|---|---|---|---|---|---|---|---|---|
| Thermosetting Composition | Composition 1 | Composition 2 | Composition 3 | Composition 4 | Composition 5 | Composition 6 | Composition 7 | Composition 8 | Composition 9 |
| Refractive index | 1.5 | 1.49 | 1.5 | 1.51 | 1.51 | 1.52 | 1.52 | 1.49 | 1.48 |
| Durometer hardness D | 60 | 20 | 35 | 50 | 60 | 64 | 60 | 35 | 28 |
| 180° C. Heat resistance test (160 hours)/yellowing | None | None | None | None | None | None | None | None | None |

TABLE 7

Refractive index, hardness and presence or absence of yellowing of cured products obtained by curing compositions of Table 5

| | Cured product 10 | Cured product 11 | Cured product 12 | Cured product 13 | Cured product 14 | Cured product 15 | Cured product 16 | Cured product 17 | Cured product 18 | Comparative cured product 1 |
|---|---|---|---|---|---|---|---|---|---|---|
| Thermosetting composition | Composition 10 | Composition 11 | Composition 12 | Composition 13 | Composition 14 | Composition 15 | Composition 16 | Composition 17 | Composition 18 | Comparative cured product 1 |
| Refractive index | 1.51 | 1.51 | 1.51 | 1.51 | 1.51 | 1.51 | 1.5 | 1.5 | 1.51 | 1.5 |
| Durometer hardness D | 55 | 50 | 50 | 45 | 30 | 40 | 30 | 40 | 35 | 50 |
| 180° C. Heat resistance test (160 hours)/yellowing | None | None | None | None | None | None | None | None | None | Observed |

The test results of the test pieces obtained from the cured product 1 and the comparative cured product 2 obtained by curing the commercially available two-pack silicone for light-emitting diode encapsulation, and the evaluation of the cured product 1 to the conventional product were shown in Table 8. ○ indicates the same degree as the conventional product, and ⊚ indicates to be excellent as compared with the conventional product.

TABLE 8

| | | Cured product 1 | Comparative cured product 2 | Evaluation |
|---|---|---|---|---|
| Total light transmittance (%) | | 98 | 98 | ○ |
| Refractive index | | 1.50 | 1.53 | ○ |
| Durometer hardness D | | 60 | 40 | ⊚ |
| 180° C. heat resistance test (260 hours) | Transmittance retention rate (400 nm, %) | 97 | 88 | ⊚ |
| | Transmittance retention rate (370 nm, %) | 92 | 74 | ⊚ |
| | Transmittance retention rate (350 nm, %) | 82 | 55 | ⊚ |
| | Yellowness (YI) | 1.2 | 5.6 | ⊚ |

TABLE 8-continued

| | Cured product 1 | Comparative cured product 2 | Evaluation |
|---|---|---|---|
| Curing shrinkage | None | None | ○ |
| Adhesive strength test (PPA) (MPa) | 2.7 | 1.6 | ⊚ |
| Heat cycling test | No breakage | No breakage | ○ |

From those results, it was confirmed that that the cured product obtained using the thermosetting composition of the present invention had good transparency, had good properties such as high refractive index of 1.49 or more, and was excellent in heat resistance (resistance to thermal yellowing, heat-resistant transparency and the like) and was excellent in adhesive strength as compared with the conventional material for phenyl silicone type light emitting diode encapsulation. It was further confirmed that the cured product obtained using the thermosetting composition of the present invention had a double-decker silsesquioxane skeleton, and therefore was excellent in insulating property.

This application is based on Japanese Patent Application filed Jun. 2, 2009 (Japanese Patent Application No. 2009-133518), and the contents thereof are herein incorporated by reference.

INDUSTRIAL APPLICABILITY

A molded body comprising the cured product of the present invention can preferably be used in use of semiconductor encapsulation materials, optical semiconductor encapsulation materials, insulating films, sealing materials, optical lenses and the like. Furthermore, the molded body can be used in transparent materials, optical materials, optical films, optical sheets, adhesives, electronic materials, insulating materials, interlaminar insulating films, paints, inks, coating materials, molding materials, potting materials, liquid crystal sealing materials, display device sealing materials, solar cell encapsulation materials, resist materials, color filters, electronic paper materials, hologram materials, solar cell materials, fuel cell materials, display materials, recording materials, water-proof materials, moisture-proof materials, cell solid electrolytes and gas separation membranes. In addition, the molded body can be used as additives and the like to other resins.

The invention claimed is:
1. A thermosetting composition comprising
(A) a liquid organosilicon compound,
(B) a silicon compound having at least two vinyl groups, and
(D) a silicon compound having at least two SiH groups at the terminals,
wherein the liquid organosilicon compound comprises a structural unit represented by the following formula (1-a) and a structural unit represented by the following formula (1-b):

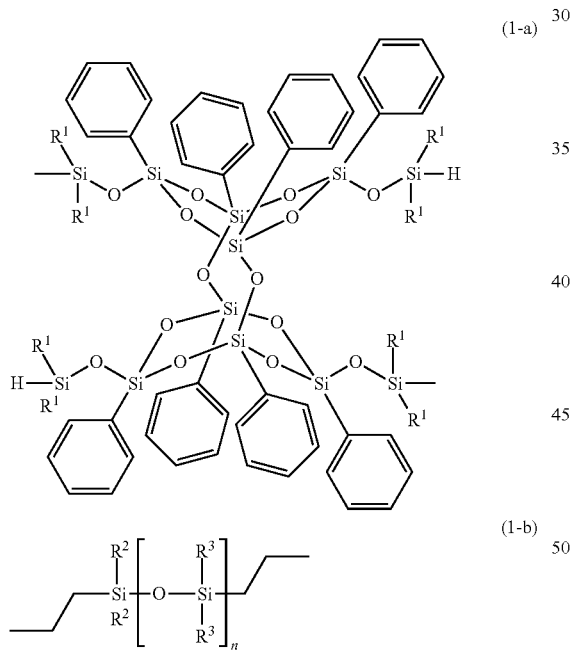

(1-a)

(1-b)

wherein $R^1$ each independently represents a group selected from an alkyl having 1 to 4 carbon atoms, cyclopentyl and cyclohexyl, $R^2$ and $R^3$ each independently represent a group selected from an alkyl having 1 to 4 carbon atoms, cyclopentyl and cyclohexyl, and n is an integer of 2 to 50, and
wherein, when a mole fraction of the structural unit represented by the formula (1-a) in the liquid organosilicon compound is α and a mole fraction of the structural unit represented by the formula (1-b) in the liquid organosilicon compound is β, the ratio of α and n×β (α:n×β) meets 1:3 to 1:100.

2. The thermosetting composition according to claim 1, further comprising (C) a platinum catalyst.
3. The thermosetting composition according to claim 1, further comprising at least one of silica and a fluorescent material dispersed therein.
4. A cured product obtainable by thermally curing the thermosetting composition according to claim 1.
5. A molded body obtainable by molding the cured product according to claim 4.
6. A coating film obtainable by applying the thermosetting composition according to claim 1.
7. An encapsulation material for an optical semiconductor, comprising the thermosetting composition according to claim 1.
8. A thermosetting composition comprising
(A) a liquid organosilicon compound, and
(B) a silicon compound having at least two vinyl groups, and
(D) a silicon compound having at least two SiH groups at the terminals,
wherein the liquid organosilicon compound is produced according to a method that comprises subjecting a compound represented by the following formula (2-a) and a compound represented by the following formula (2-b) to a hydrosilylation reaction, wherein when a mole fraction of the structural unit represented by the formula (2-a) in the liquid organosilicon compound is α and a mole fraction of the structural unit represented by the formula (2-b) in the liquid organosilicon compound is β, those meet the following relation equation:

α:n×β=1:3 to 1:100

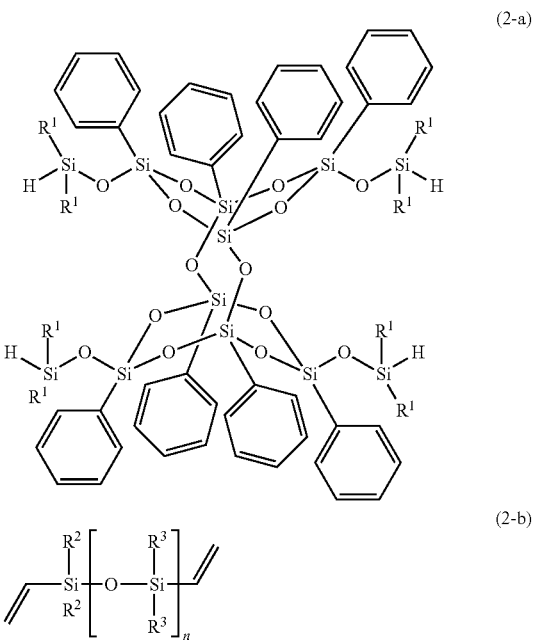

(2-a)

(2-b)

wherein $R^1$ each independently represents a group selected from an alkyl having 1 to 4 carbon atoms, cyclopentyl and cyclohexyl, $R^2$ and $R^3$ each independently represent a group selected from an alkyl having 1 to 4 carbon atoms, cyclopentyl and cyclohexyl, and n is an integer of 2 to 50.

9. The thermosetting composition according to claim 8, further comprising (C) a platinum catalyst.

10. The thermosetting composition according to claim 8, further comprising at least one of silica and a fluorescent material dispersed therein.

11. A cured product obtainable by thermally curing the thermosetting composition according to claim 8.

12. A molded body obtainable by molding the cured product according to claim 11.

13. A coating film obtainable by applying the thermosetting composition according to claim 8.

14. An encapsulation material for an optical semiconductor, comprising the thermosetting composition according to claim 8.

* * * * *